United States Patent
Sasaki et al.

(10) Patent No.: US 9,987,721 B2
(45) Date of Patent: Jun. 5, 2018

(54) DOUBLE-SIDE POLISHING METHOD

(71) Applicant: SHIN-ETSU HANDOTAI CO., LTD., Tokyo (JP)

(72) Inventors: Masanao Sasaki, Nishigo-mura (JP); Kazuaki Aoki, Nishigo-mura (JP); Taichi Yasuda, Tokyo (JP); Taketoshi Sato, Takasaki (JP); Takehiro Yuasa, Takasaki (JP); Kazumasa Asai, Nagano (JP); Daisuke Furukawa, Suzaka (JP)

(*) Notice: Subject to any disclaimer, the term of this patent is extended or adjusted under 35 U.S.C. 154(b) by 217 days.

(21) Appl. No.: 14/421,578

(22) PCT Filed: Aug. 8, 2013

(86) PCT No.: PCT/JP2013/004785
§ 371 (c)(1),
(2) Date: Feb. 13, 2015

(87) PCT Pub. No.: WO2014/038129
PCT Pub. Date: Mar. 13, 2014

(65) Prior Publication Data
US 2015/0217425 A1    Aug. 6, 2015

(30) Foreign Application Priority Data
Sep. 6, 2012 (JP) .................................. 2012-196642

(51) Int. Cl.
*B24B 37/28* (2012.01)
*B24B 37/08* (2012.01)
(Continued)

(52) U.S. Cl.
CPC ............. *B24B 37/28* (2013.01); *B24B 37/08* (2013.01); *H01L 21/02024* (2013.01); *H01L 21/304* (2013.01)

(58) Field of Classification Search
CPC ....... B24B 37/28; B24B 37/08; B24B 37/042; B24B 37/32
(Continued)

(56) References Cited

U.S. PATENT DOCUMENTS

| | | |
|---|---|---|
| 6,454,635 B1 | 9/2002 | Zhang et al. |
| 7,541,287 B2 | 6/2009 | Schmolke et al. |

(Continued)

FOREIGN PATENT DOCUMENTS

| | | |
|---|---|---|
| CN | 101264585 A | 9/2008 |
| DE | 10 2005 034 119 B3 | 12/2006 |

(Continued)

OTHER PUBLICATIONS

Dec. 30, 2015 Search Report issued in Chinese Patent Application No. 2013800461389.

(Continued)

*Primary Examiner* — Monica Carter
*Assistant Examiner* — Lauren Beronja

(57) ABSTRACT

A double-side polishing method of polishing both surfaces of a wafer by holding the wafer with a carrier including a holding hole configured to hold the wafer and a ring-shaped resin insert disposed along an internal circumference of the holding hole, the resin insert having an inner circumferential surface configured to contact a peripheral portion of the wafer, interposing the carrier between upper and lower turn tables to which polishing pads are attached, polishing both the surfaces of the wafer while maintaining planarity of the inner circumferential surface at or below 100 μm and verticalness of the inner circumferential surface at or below 5°. The method can inhibit the degradation of the flatness of the polished wafer, such as particularly an outer circumferential sag, due to variation in shape of the inner circumferential surface of the resin insert of a carrier.

12 Claims, 3 Drawing Sheets

(51) Int. Cl.
  *H01L 21/304* (2006.01)
  *H01L 21/02* (2006.01)

(58) Field of Classification Search
  USPC .......................... 451/269, 364, 262, 287, 10
  See application file for complete search history.

(56) References Cited

U.S. PATENT DOCUMENTS

| | | |
|---|---|---|
| 2006/0128276 A1 | 6/2006 | Horiguchi et al. |
| 2008/0057831 A1 | 3/2008 | Kanda et al. |
| 2008/0166952 A1 | 7/2008 | Ueno |
| 2008/0227371 A1 | 9/2008 | Onishi et al. |
| 2009/0104852 A1 | 4/2009 | Pietsch et al. |
| 2010/0311312 A1 | 12/2010 | Furukawa |
| 2011/0104995 A1 | 5/2011 | Ueno et al. |
| 2011/0124271 A1* | 5/2011 | Sato ........................ B24B 37/28 451/41 |
| 2012/0100788 A1* | 4/2012 | Yasuda ................... B24B 37/28 451/364 |

FOREIGN PATENT DOCUMENTS

| | | |
|---|---|---|
| DE | 10 2007 049 811 A1 | 4/2009 |
| EP | 0887152 A2 | 12/1998 |
| JP | 2000-301451 A | 10/2000 |
| JP | 2010-050193 A | 3/2010 |
| JP | 2010-179375 A | 8/2010 |
| JP | 2010-280026 A | 12/2010 |
| JP | 2011-025322 A | 2/2011 |
| JP | 2011-240460 A | 12/2011 |
| KR | 10-0695341 B1 | 3/2007 |
| TW | 201114546 A1 | 5/2011 |
| WO | 2006/090661 A1 | 8/2006 |
| WO | 2009107333 A1 | 9/2009 |
| WO | 2010/021086 A1 | 2/2010 |

OTHER PUBLICATIONS

Oct. 22, 2015 Search Report issued in Taiwanese Patent Application No. 102129515.
Search Report issued in PCT/JP2013/004785 dated Sep. 17, 2013.

* cited by examiner (A)          (B)

DOUBLE-SIDE POLISHING METHOD

TECHNICAL FIELD

The present invention relates to a double-side polishing method of simultaneously polishing both surfaces of a wafer with a carrier for double-side polishing.

BACKGROUND ART

In simultaneous polishing of both surfaces of a wafer such as double-side polishing, the wafer is held with a carrier for use in a double-side polishing apparatus.

FIG. 8 is a schematic diagram for explanation of wafer double-side polishing with a common double-side polishing apparatus conventionally used. As shown in FIG. 8, the carrier 102 of the double-side polishing apparatus 101 has a holding hole 104 for holding a wafer W. The carrier 102 is formed with a thickness thinner than that of the wafer W.

The wafer W is inserted and held in the holding hole 104. The upper and lower surfaces of the wafer W are interposed between polishing pads 107, which are disposed on the opposing sides of an upper turn table 105 and a lower turn table 106.

The carrier 102 is engaged with a sun gear 108 and an internal gear 109 and thereby rotated and revolved by the rotation of the sun gear 108. The upper turn table 105 and the lower turn table 106 are rotated in opposite directions while a polishing agent is supplied to polishing surfaces such that both surfaces of the wafer W are simultaneously polished by the polishing pads 107 attached to the upper and lower turn tables 105, 106.

The carrier 102 of this type, used in double-side polishing of the wafer W, is usually made of metal. Accordingly, a resin insert 103 to protect a peripheral portion of the wafer W from damage due to the metal carrier 102 is mounted along the internal circumference of the holding hole 104 of the carrier 102 (See Patent Document 1, for example).

CITATION LIST

Patent Literature

Patent Document 1: Japanese Unexamined Patent publication (Kokai) No. 2011-25322

SUMMARY OF INVENTION

Technical Problem

There is a problem in that as double-side polishing is repeated with a carrier having a resin insert as above, the flatness of wafers becomes easy to degrade: for example a sag is produced at the outer circumference of a wafer.

The present inventors then investigated the cause and found that slight irregularities formed on an inner circumferential surface of a resin insert gradually become large over time due to wear through use of a carrier and the resultant irregularities cause the degradation of flatness.

The present invention was accomplished in view of the above-described problems. It is an object of the present invention to provide a double-side polishing method that can inhibit the degradation of wafer flatness, such as particularly an outer circumferential sag, due to variation in shape of the inner circumferential surface of a resin insert of a carrier.

Solution to Problem

To achieve this object, the present invention provides a double-side polishing method of simultaneously polishing both surfaces of a wafer by holding the wafer with a carrier including a holding hole configured to hold the wafer and a ring-shaped resin insert disposed along an internal circumference of the holding hole, the resin insert having an inner circumferential surface configured to contact a peripheral portion of the wafer to be held, and interposing the carrier between upper and lower turn tables to which polishing pads are attached, the method comprising: polishing both the surfaces of the wafer while maintaining planarity of the inner circumferential surface at or below 100 μm and verticalness of the inner circumferential surface at or below 5°, where the planarity is defined by the maximum difference in elevation of irregularities of the inner circumferential surface of the resin insert, and the verticalness is defined by an angle formed between a straight line perpendicular to a main surface of the carrier and a straight line joining an upper edge portion and a lower edge portion of the inner circumferential surface.

The double-side polishing method thus performed can inhibit the degradation of wafer flatness due to variation in shape of the inner circumferential surface of the resin insert of the carrier.

After polishing both the surface of the wafer, the inner circumferential surface of the resin insert may be ground or cut to maintain the planarity and the verticalness.

In this manner, the planarity and the verticalness can be readily maintained within the above ranges.

In this case, both the surfaces of the wafer are preferably polished while the planarity is maintained at or below 25 μm and the verticalness is maintained at or below 2°.

In this manner, the degradation of wafer flatness due to variation in shape of the inner circumferential surface of the resin insert of the carrier can reliably inhibited.

Moreover, the upper and lower turn tables can interpose a plurality of the carriers therebetween to simultaneously polish both surfaces of a plurality of the wafers.

In this manner, a plurality of wafers can be simultaneously polished in a batch process; the process time can thereby be reduced.

In this case, both the surfaces of the wafers are preferably polished while a difference in inner diameter among the respective resin inserts of the plurality of the carriers is maintained at or below 0.5 mm.

This method can inhibit the occurrence of the difference in polishing rate among the wafers due to an increased difference in inner diameter among the resin inserts when the plurality of the wafers are simultaneously polished in a batch process, thereby enabling the inhibition of variation in finishing thickness of the wafers and hence the degradation of flatness.

Advantageous Effects of Invention

The inventive method of double-side polishing a wafer polishes both surfaces of the wafer while maintaining the planarity of the inner circumferential surface of a resin insert of a carrier at or below 100 μm and the verticalness at or below 5°, thereby enabling the inhibition of the degradation of flatness of the wafer due to variation in shape of the inner circumferential surface of the resin insert of the carrier.

DESCRIPTION OF EMBODIMENTS

Hereinafter, embodiments of the present invention will be described, but the present invention is not limited to these embodiments.

As described previously, wafer double-side polishing with a carrier having a resin insert has the problem in that the inner circumferential surface of the resin insert is worn down by contact with a wafer peripheral portion through use of the carrier over time; thereby the irregularities formed on the inner circumferential surface of the resin insert gradually become large; the degradation of flatness of a wafer to be polished, such as the occurrence of the outer circumferential sag of the wafer, becomes easy to occur.

In view of this, the inventors diligently conducted study to solve this problem and consequently found the following, thereby bringing the invention to completion.

In the first place, planarity and verticalness were defined to evaluate an irregular state of the inner circumferential surface of a resin insert: the planarity of the inner circumferential surface was defined by the maximum difference in elevation of irregularities of the inner circumferential surface; the verticalness of the inner circumferential surface was defined by an angle formed between a straight line perpendicular to a main surface of the carrier and a straight line joining an upper edge portion and a lower edge portion of the inner circumferential surface. Double-side polishing with the planarity maintained at or below 100 μm and the verticalness at or below 5° enables the inhibition of the degradation of flatness of a wafer to be polished. Processing the inner circumferential surface of the resin insert into a flat surface suffices to maintain the planarity and verticalness of the inner circumferential surface.

Furthermore, the inventors found that there arises the following problem when both surfaces of plural wafers are simultaneously polished with plural carriers (plural resin inserts) in a batch process: as the processing of the inner circumferential surface is repeated, the difference in inner diameter among the resin inserts tends to increase; the polishing rate thus varies in every carrier and the variation in finishing thickness of the wafers polished in the same batch process increases. In double-side polishing, the difference between the carrier thickness and the wafer finishing thickness, a gap, affects the wafer flatness. The increase in finishing thickness variation accordingly degrades the flatness.

When the difference in inner diameter is maintained within a prescribed range, the variation in the finishing thickness and hence the degradation of the flatness can further be inhibited.

The inventive double-side polishing method will now be described in detail with reference to FIG. 1.

Figure 1:
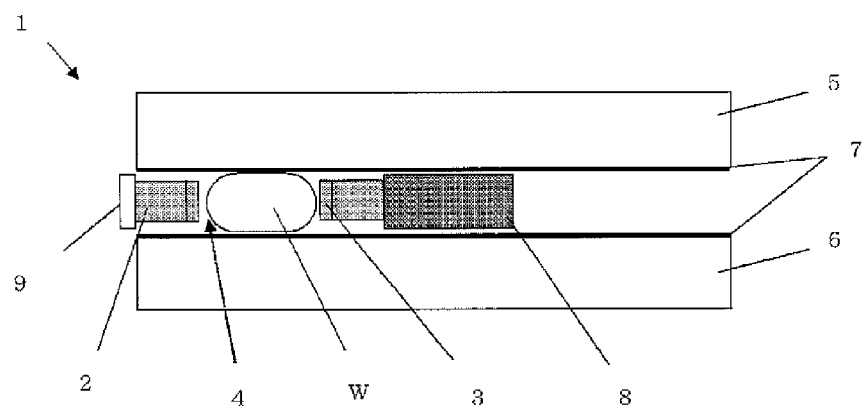
FIG. 1 is a schematic diagram explaining wafer polishing according to the inventive double-side polishing method.

As shown in FIG. 1, the carrier 2 of the double-side polishing apparatus 1 has a holding hole 4 for holding a wafer W. The carrier 2 is formed with a thickness thinner than that of the wafer W.

In the carrier 2, a ring-shaped resin insert 3 is disposed along the internal circumference of the holding hole 4. The inner circumferential surface of the resin insert 3 is configured to contact a peripheral portion of the wafer so as to protect the wafer from damaging by the carrier 2.

The wafer W is inserted and held in the holding hole 4. The upper and lower surfaces of the wafer W are interposed between polishing pads 7, which are disposed on the opposing sides of an upper turn table 5 and a lower turn table 6.

The carrier 2 is engaged with a sun gear 8 and an internal gear 9 and thereby rotated and revolved by the rotation of the sun gear 8.

The inventive double-side polishing method is a method of simultaneously polishing both surfaces of a wafer with a double-side polishing apparatus of this type.

First, the planarity and verticalness of the inner circumferential surface of the resin insert 3 are measured. The measurement can be performed with, for example, a two-dimensional displacement meter. Whether the planarity is 100 μm or less and the verticalness is 5° or less is then checked.

The planarity and verticalness will now be described with reference to FIG. 2 at (A) and (B).

Figure 2:
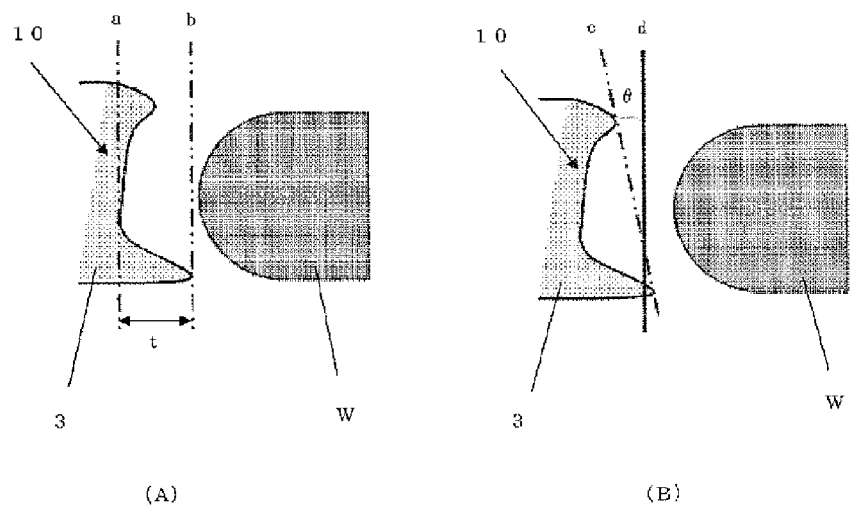
FIG. 2 is an explanatory diagram of the planarity and verticalness of the inner circumferential surface of a resin insert according to the inventive double-side polishing method.

As shown in FIG. 2 at (A), there are slight irregularities on the inner circumferential surface 10 of the resin insert 3. The "planarity of the inner circumferential surface" in the present invention means the difference in elevation between the most depressed portion 'a' of and the most protruding portion 'b' of the inner circumferential surface 10, that is, the maximum difference (t) in elevation of the irregularities.

As shown in FIG. 2 at (B), the "verticalness of the inner circumferential surface" in the present invention means an angle (θ) formed between a straight line 'd', which is perpendicular to a main surface of the carrier, and a straight line 'c', which joins an upper edge portion of and a lower edge portion of the inner circumferential surface 10.

If the result of the check demonstrates that the planarity exceeds 100 μm or the verticalness exceeds 5°, then the inner circumferential surface of the resin insert 3 is processed such that the planarity becomes 100 μm or less and the verticalness becomes 5° or less. This process may be a grinding process or a cutting process with a processing machine such as an NC milling machine.

Next, the wafer W is held in the holding hole 4 of the carrier 2 having the resin insert 3 in which the planarity of the inner circumferential surface 10 is maintained at or below 100 μm and the verticalness of the inner circumferential surface 10 is maintained at or below 5°. The carrier 2 holding the wafer W is disposed between the upper turn table 5 and the lower turn table 6.

The upper and lower polishing surfaces of the wafer W are then interposed between the polishing pads 7 each attached to the upper turn table 5 and the lower turn table 6. The upper turn table 5 and the lower turn table 6 are rotated in opposite directions while a polishing agent is supplied to the polishing surfaces such that both the surfaces of the wafer W are simultaneously polished by the polishing pads 7.

In the polishing, other polishing conditions may be the same as a conventional double-side polishing method.

After the wafer W has been polished and before a next wafer W will be polished, the planarity and verticalness of the inner circumferential surface are measured and checked to perform polishing while the planarity is always maintained at or below 100 μm and the verticalness at or below 5°.

The inventive double-side polishing method thus performed enables the inhibition of the degradation of flatness such as the outer circumferential sag of the wafer, which conventionally occurs due to the variation in shape caused by wear of the inner circumferential surface 10 of the resin insert 3. The method can thereby obtain a wafer with the degradation of ESFQRmax inhibited.

In the above embodiment, the measurement of the planarity and verticalness and the processing of the inner circumferential surface are performed every time before polishing of a wafer W or after polishing of a wafer W. The present invention is however not limited to this embodiment.

The timing with which the measurement of the planarity and verticalness and the processing of the inner circumferential surface are performed may be periodic: for example, the relationship between the usage time of the carrier (resin insert) and a change with passage of time in the planarity and verticalness of the inner circumferential surface is previously investigated to calculate the usage time of the carrier at which the inner circumferential surface needs to be processed, and this usage time of the carrier may be used as the above timing.

As described previously, it suffices to maintain the planarity and the verticalness at or below 100 μm and at or below 5°, respectively. In particular, the planarity is preferably maintained at or below 25 μm and the verticalness at or below 2°. In this manner, the degradation of flatness of a wafer to be polished can reliably be inhibited.

In addition, in one batch process of double-side polishing, the upper and lower turn tables 5, 6 can interpose the carriers 2 each holding wafers W therebetween to simultaneously polish both the surfaces of the wafers.

In this manner, the polishing process time can be reduced and the productivity can be improved.

In this case, both the surfaces of the wafers W are preferably polished while the difference in inner diameter among the respective resin inserts 3 of the carriers is maintained at or below 0.5 mm.

The "inner diameter" described herein is represented by the diameter of an approximate circle after fitting, by the least squares method, of a round shape obtained by measuring the circumferential position along the inner circumferential surface of the resin insert with a displacement meter.

The "difference in inner diameter" is represented by the difference between the maximum and the minimum of the inner diameter among the resin inserts of the carriers simultaneously used in one batch process of double-side polishing.

Managing the difference in inner diameter among the resin inserts in such a manner enables the finishing thicknesses of the wafers polished in the same polishing batch to be uniform, thereby reducing the variation in wafer flatness.

It is to be noted that the inventive double-side polishing method can use a double-side polishing apparatus of the type that includes plural holding holes and resin inserts in one carrier. As in the above embodiment, a preferable aspect in this case is that both the surfaces of the wafers are polished while the difference in inner diameter among the resin inserts disposed in the respective holding holes is maintained at or below 0.5 mm.

EXAMPLE

The present invention will be more specifically described below with reference to examples and comparative example, but the present invention is not limited to these examples.

Example 1 and Comparative Example

Silicon wafers having a diameter of 300 mm were double-side polished. At this time, five wafers were simultaneously polished in one batch process with a double-side polishing apparatus (DSP-20B made by Fujikoshi Machinery Corp.) having five carriers, each of which was configured to hold one of the wafers. Polishing pads made of urethane foam were used. A polishing agent including colloidal silica in an alkaline solution was used.

First, the inner circumferential surface of the resin inserts of all the carriers was cut such that the planarity was 25 μm or less and the verticalness was 2° or less. After the cutting, the planarity and verticalness of the inner circumferential surface and the inner diameter of the resin inserts of all the carriers were inspected by form measurement with a two-dimensional displacement meter made by Keyence Corp. The result was that the planarity of the inner circumferential surface of all the resin inserts was in the range from 12.91 μm to 22.73 μm; the verticalness was in the range from 0.86° to 1.9°. The minimum value of the inner diameter of the resin inserts was 301.069 mm; the maximum value was 301.510 mm; the difference in the inner diameter was 0.441 mm.

With these carriers, double-side polishing was continuously repeated for 31,000 minutes to measure the planarity and verticalness of the inner circumferential surface and ESFQRmax (the maximum of an edge site front least squares range) of the polished wafers. The ESFQRmax was measured with Wafer Sight made by KLA-Tencor Co., Ltd.

Figure 3:
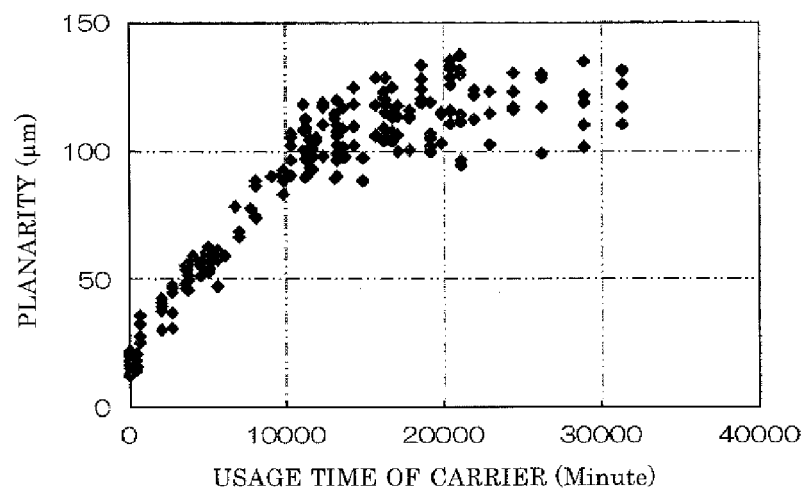
FIG. 3 is a graph showing the relationship between the usage time of carriers and the planarity in example 1 and comparative example.
Figure 4:
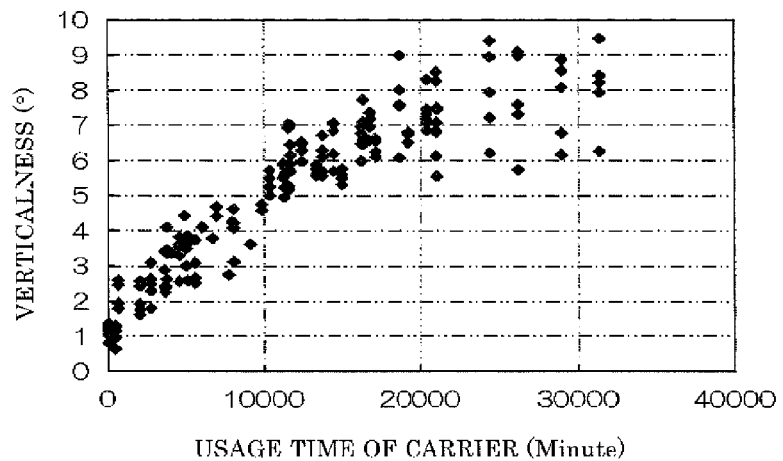
FIG. 4 is a graph showing the relationship between the usage time of carriers and the verticalness in example 1 and comparative example.

The measurement result of the planarity is shown in FIG. 3 and the measurement result of the verticalness in FIG. 4. As shown in FIGS. 3 and 4, it was revealed that both the planarity and verticalness degraded through use of the carriers over time. In addition, when the usage time of the carriers was 10,000 minutes or less, the planarity and the verticalness were maintained at or below 100 μm and at or below 5°, respectively (Example 1). The measurement result of the planarity and verticalness of the inner circumferential surface of the resin inserts right before the usage time of the carriers exceeded 10,000 minutes was that the planarity was in the range from 83.74 μm to 93.27 μm and the verticalness was in the range from 4.6° to 4.9°, where each value was the average in five carriers.

When the usage time of the carriers exceeded 10,000 minutes, the planarity of the inner circumferential surface exceeded 100 μm; the verticalness exceeded 5° (Comparative Example).

These results revealed that under the above conditions, if the upper limit of the usage time of the carriers is 10,000 minutes and the inner circumferential surface of the resin inserts is periodically processed, then the planarity and verticalness of the inner circumferential surface of the resin inserts are maintained at or below 100 μm and at or below 5°, respectively.

Figure 5:
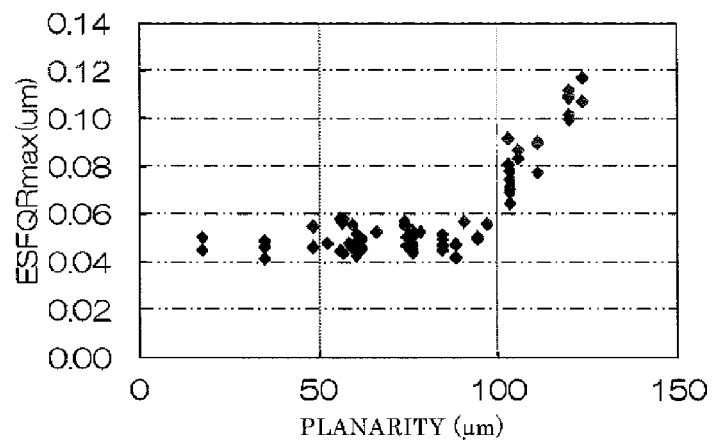
FIG. 5 is a graph showing the relationship between ESFQRmax and the planarity in example 1 and comparative example.
Figure 6:
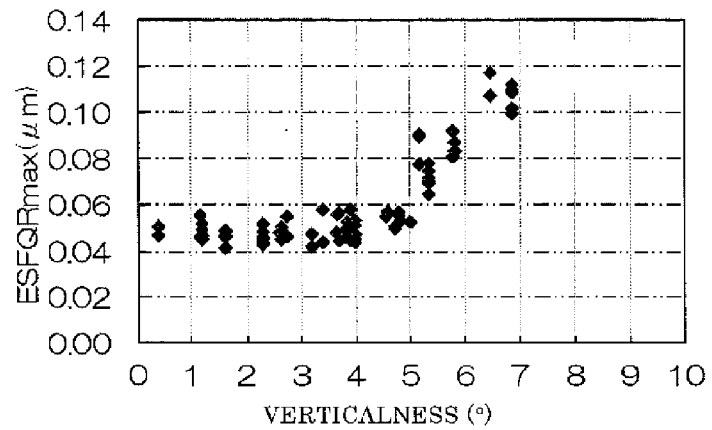
FIG. 6 is a graph showing the relationship between ESFQRmax and the verticalness in example 1 and comparative example.

The result of ESFQRmax is shown in FIGS. 5 and 6. As shown in FIGS. 5 and 6, it was revealed that when the planarity was maintained at or below 100 μm and the verticalness at or below 5°, a good result of ESFQRmax was obtained. The flatness of all the double-side polished wafers from the start of polishing to the 11-th batch process was measured; the average of ESFQRmax was a good value of 0.050 μm (N=55). Moreover, the average of ESFQRmax until the usage time of the carriers reached 10,000 minutes was 0.048 μm (N=2,000). This value was almost as good as the flatness of a wafer immediately after 11 batch processes of double-side polishing were performed with a carrier right after its resin insert was processed.

The average of ESFQRmax after the usage time of the carriers exceeded 10,000 minutes, in contrast, was 0.090 μm (N=20), which was greatly worse than 0.048 μm, the result in example 1.

From the these result, it was confirmed that since the inventive double-side polishing method polishes both surfaces of a wafer while maintaining the planarity of the inner circumferential surface of a resin insert at or below 100 μm and the verticalness at or below 5°, the degradation of wafer flatness due to variation in shape of the inner circumferential surface of the resin insert of the carrier can be inhibited.

Example 2

Silicon wafers were double-side polished under the same conditions as in example 1 to measure the difference in inner diameter among the resin inserts and variation in wafer finishing thickness in the same batch process. In the double-side polishing, wafers having a thickness ranging from 791.2 μm to 791.3 μm were used. The wafer thickness was measured with Wafer Sight made by KLA-Tencor Co., Ltd.

Figure 7:
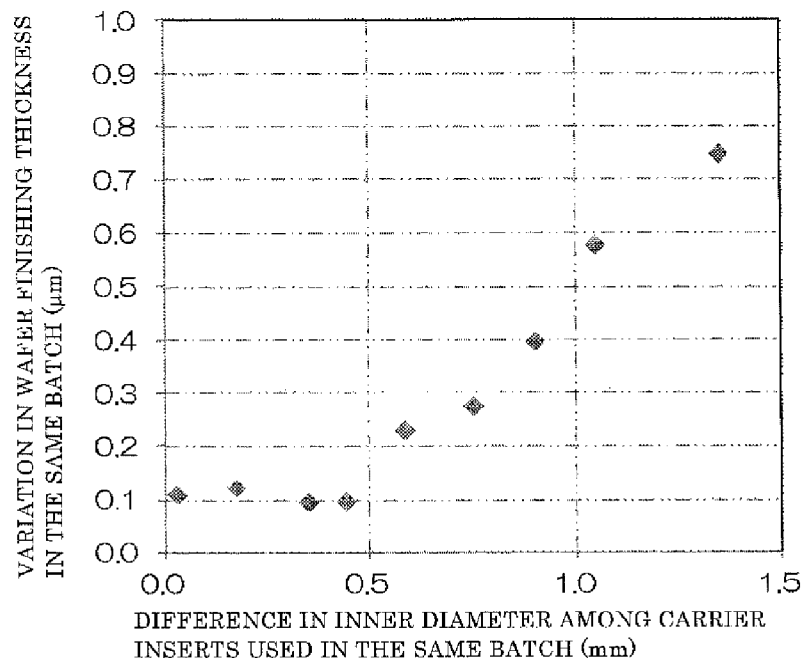
FIG. 7 is a graph showing the relationship between the difference in inner diameter among the resin inserts and the finishing thickness in example 2.
Figure 8:
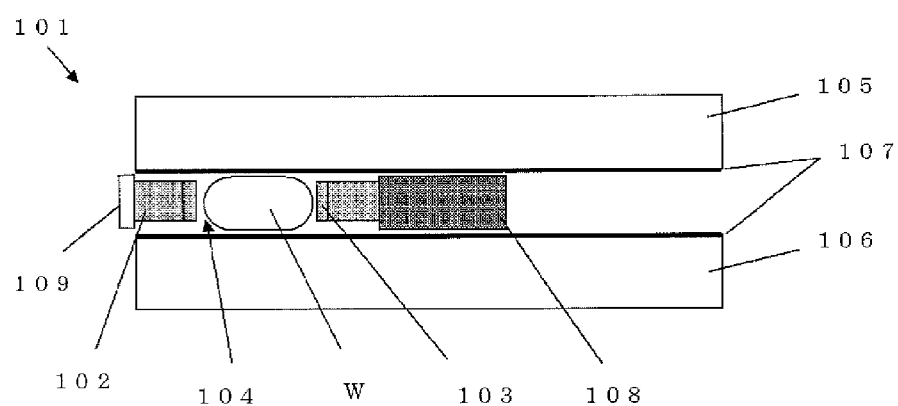
FIG. 8 is a schematic diagram explaining wafer double-side polishing with a conventional double-side polishing apparatus.

The result is shown in FIG. 7. As shown in FIG. 7, when the difference in inner diameter was 0.5 mm or less, the average value of the variation in wafer finishing thickness was a good value of 0.107 μm. In addition, no significant difference in the variation in wafer finishing thickness was observed among all the cases of four results where the difference in inner diameter was 0.5 mm or less. More specifically, the variation in wafer finishing thickness due to the difference in inner diameter did not increase.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A double-side polishing method of simultaneously polishing both surfaces of a wafer by holding the wafer with a carrier including a holding hole configured to hold the wafer and a ring-shaped resin insert disposed along an internal circumference of the holding hole, the resin insert having an inner circumferential surface configured to contact a peripheral portion of the wafer to be held, and interposing the carrier between upper and lower turn tables to which polishing pads are attached, the method comprising:

polishing both the surfaces of the wafer while maintaining planarity of the inner circumferential surface at or below 100 μm and verticalness of the inner circumferential surface at or below 5°, where the planarity is defined by the maximum difference in elevation of irregularities of the inner circumferential surface of the resin insert, and the verticalness is defined by an angle formed between a straight line perpendicular to a main surface of the carrier and a straight line joining an upper edge portion and a lower edge portion of the inner circumferential surface.

2. The double-side polishing method according to claim 1, wherein after polishing both the surface of the wafer, the inner circumferential surface of the resin insert is ground or cut to maintain the planarity and the verticalness.

3. The double-side polishing method according to claim 1, wherein both the surfaces of the wafer are polished while the planarity is maintained at or below 25 μm and the verticalness is maintained at or below 2°.

4. The double-side polishing method according to claim 2, wherein both the surfaces of the wafer are polished while the planarity is maintained at or below 25 μm and the verticalness is maintained at or below 2°.

5. The double-side polishing method according to claim 1, wherein the upper and lower turn tables interpose a plurality of the carriers therebetween to simultaneously polish both surfaces of a plurality of the wafers.

6. The double-side polishing method according to claim 2, wherein the upper and lower turn tables interpose a plurality of the carriers therebetween to simultaneously polish both surfaces of a plurality of the wafers.

7. The double-side polishing method according to claim 3, wherein the upper and lower turn tables interpose a plurality of the carriers therebetween to simultaneously polish both surfaces of a plurality of the wafers.

8. The double-side polishing method according to claim 4, wherein the upper and lower turn tables interpose a plurality of the carriers therebetween to simultaneously polish both surfaces of a plurality of the wafers.

9. The double-side polishing method according to claim 5, wherein both the surfaces of the wafers are polished while a difference in inner diameter among the respective resin inserts of the plurality of the carriers is maintained at or below 0.5 mm.

10. The double-side polishing method according to claim 6, wherein both the surfaces of the wafers are polished while a difference in inner diameter among the respective resin inserts of the plurality of the carriers is maintained at or below 0.5 mm.

11. The double-side polishing method according to claim 7, wherein both the surfaces of the wafers are polished while a difference in inner diameter among the respective resin inserts of the plurality of the carriers is maintained at or below 0.5 mm.

12. The double-side polishing method according to claim 8, wherein both the surfaces of the wafers are polished while a difference in inner diameter among the respective resin inserts of the plurality of the carriers is maintained at or below 0.5 mm.

* * * * *